United States Patent [19]

Nguyen et al.

[11] Patent Number: 5,557,140
[45] Date of Patent: Sep. 17, 1996

[54] PROCESS TOLERANT, HIGH-VOLTAGE, BI-LEVEL CAPACITANCE VARACTOR DIODE

[75] Inventors: Chanh M. Nguyen, Newbury Park; Michael G. Case, Thousand Oaks; William W. Hooper, Westlake Village; Authi A. Narayanan, Thousand Oaks, all of Calif.

[73] Assignee: Hughes Aircraft Company, Los Angeles, Calif.

[21] Appl. No.: 420,959

[22] Filed: Apr. 12, 1995

[51] Int. Cl.$^6$ .................................................. H01L 29/93
[52] U.S. Cl. .......................... 257/596; 257/595; 257/615; 257/657
[58] Field of Search ...................... 257/312, 313, 257/595, 596, 597, 598, 599, 600, 601, 602, 615, 657

[56] References Cited

U.S. PATENT DOCUMENTS

| | | |
|---|---|---|
| 3,201,664 | 8/1965 | Adam . |
| 3,764,415 | 10/1973 | Raabe et al. . |
| 4,868,134 | 9/1989 | Kasahara ........................ 437/27 |
| 4,876,211 | 10/1989 | Kanber et al. ................... 437/22 |

OTHER PUBLICATIONS

Norwood, Marcus H., et al., *Voltage Variable Capacitor Tuning: A Review*, Proceedings of the IEEE, vol. 56, No. 5, May, 1968.
Bogart, Theodore F., *Electronic Devices and Circuits*, MacMillan Publishing Company, New York, 1993, pp. 891–893.
Singh, Jasprit., *Semiconductor Devices*, McGraw-Hill, Inc., New York, 1994, pp. 192–208.
Sze, S. M., *High-Speed Semiconductor Devices*, Wiley-Interscience Publications, New York, 1990, pp. 539–544.

*Primary Examiner*—Ngân V. Ngô
*Attorney, Agent, or Firm*—V. D. Duraiswamy; W. K. Denson-Low

[57] ABSTRACT

A doping profile is disclosed for realizing a varactor diode that exhibits a high breakdown voltage $V_{BR}$, e.g.,>100 volts, and a capacitance which has a bi-level characteristic. In particular, the capacitance has a $C_{max}$ level and a $C_{min}$ level. The doping profile includes two lightly doped regions and, between them, a third region with higher doping. The doping concentrations and widths of the first two regions substantially set the tuning ratio of $C_{max}/C_{min}$, and the doping concentration and width of the third region substantially sets the transition voltage $V_{TR}$ between the bi-level capacitances.

6 Claims, 4 Drawing Sheets

PROCESS TOLERANT, HIGH-VOLTAGE, BI-LEVEL CAPACITANCE VARACTOR DIODE

BACKGROUND OF THE INVENTION

1. Field of the Invention

The present invention relates generally to high-voltage varactor diodes.

2. Description of the Related Art

In a semiconductor, charge carriers (electrons or holes) diffuse from a high carrier-density region to a low carrier-density region. For this reason, charge carriers diffuse across the junction of an unbiased semiconductor diode to create a depletion region of ionized atoms, i.e., atoms which have lost their mobile carriers. Once this built-in potential $V_{bi}$ has been established by the initial diffusion, it acts as a barrier to further diffusion.

If a reverse bias is imposed across the diode, the depletion region widens to expose a region of negative charges (due to acceptor atoms) on one side of the junction and a region of positive charges (due to donor atoms) on the other. The width of the depletion region is a function of the impurity doping levels of the diode junction. If both sides of the junction are equally doped, the depletion region will extend an equal distance from the junction. With unequal doping levels, the depletion region will extend farther into the side which has the smaller impurity concentration.

The electric field is found by integrating the negative and positive charges. In contrast, the potential drop across the junction is found by a second charge integration or, equivalently, an integration of the electric field. If the doping concentration is constant, the electric field in the depletion region peaks at the junction and decreases linearly to the edges of the depletion region. In this case, the potential drop across the depletion region has a quadratic form.

If the reverse bias is increased to a breakdown voltage $V_{BR}$, a large reverse current results because the electric field at the junction exceeds the dielectric strength of the diode's semiconductor material. Covalent atomic bonds are ruptured, a large number of minority carriers are released and the diode is said to avalanche. The electric field and potential drop of depletion regions has been developed by many authors (e.g., Singh, Jasprit., *Semiconductor Devices*, McGraw-Hill, Inc., New York, 1994, pp. 192–208). In contrast with diodes that are purposely intended to operate in breakdown (e.g., see microwave IMPATT diodes in Sze, S. M., *High-Speed Semiconductor Devices*, Wiley-Interscience Publications, New York, 1990, pp. 539–544), varactor diodes are generally configured to avoid breakdown over an operational reverse-bias range.

In a varactor diode, each side of the diode junction is conductive and the depletion region acts as a dielectric so that a reverse-biased semiconductor junction has the structure of a capacitor, i.e., two conducting regions separated by a dielectric. The capacitance depends directly on the junction area and inversely on the width of the depletion region, i.e., $C=(\epsilon A)/d$ in which s is the dielectric constant, A is the junction's cross-sectional area and d is the width of the depletion region. The diode capacitance decreases with increased reverse bias because this change in bias causes the depletion width to increase. The capacitance ratio over a specified reverse bias range is generally referred to as the tuning ratio. These and other varactor diode basics are described in a variety of sources (e.g., Norwood, Marcus H., et al., *Voltage Variable Capacitor Tuning: A Review*, Proceedings of the IEEE, Vol. 56, No. 5, May, 1968).

Varactors find utility in a variety of electronic circuits. For example, a varactor diode in a resonant circuit can control the frequency of a voltage-controlled oscillator (VCO) or the amplifier frequency in a receiver. Typically, VCOs and receiver amplifiers are tuned smoothly across their operating bands. Accordingly, varactor diodes for these applications usually exhibit a capacitance that is proportional to an exponential power of the reverse-bias voltage $V_r$, e.g., $C \propto (V_r)^{-0.5}$. This exponential relationship between capacitance and bias voltage is a feature of abrupt and hyperabrupt varactor diodes. Abrupt-junction diodes have uniform doping on each side of the junction with an abrupt transition at the junction. In hyperabrupt-junction diodes, the doping level increases as the junction is approached from either side. A detailed description of these varactor diodes can be found in numerous references (e.g., Bogart, Theodore F., *Electronic Devices and Circuits*, MacMillan Publishing Company, New York, 1993, pp. 891–893).

In contrast, some applications require varactor diodes whose capacitance is an irregular function of bias voltage. For example, power electronic systems develop voltage and current forms as required by user loads. They often include serially-connected resonant converters which utilize switching circuits to achieve high power-conversion efficiencies. To reduce switching stresses and excess production of electromagnetic interference, each switch is preferably switched by control and timing circuits when the switch's voltage and/or current is at a minimum. The design of the control and timing circuits would be facilitated by the availability of a high-breakdown varactor diode that exhibited a bi-level capacitance characteristic.

In particular, a preferred varactor diode for these switching applications has the following characteristics relative to an applied reverse bias $V_r$: (a) a high reverse breakdown $V_{BR}$, e.g., preferably>100 volts, (b) a large tuning ratio of maximum capacitance $C_{max}$ to minimum capacitance $C_{min}$, e.g., preferably $C_{max}/C_{min}>2:1$, (c) a rapid transition between $C_{max}$ and $C_{min}$ in the region of a transition voltage $V_{TR}$, (d) the transition voltage $V_{TR}$ occurs between a selected minimum $V_{TR(min)}$ and a selected maximum $V_{TR(max)}$, (e) the maximum capacitance $C_{max}$ is substantially constant for $0<V_r<V_{TR}$, and (f) the minimum capacitance $C_{min}$ is substantially constant for $V_{TR}<V_r<V_{BR}$. The high $V_{BR}$ and the high $C_{max}/C_{min}$ parameters are particularly desirable characteristics of the preferred varactor diode.

Presently vailable varactor diodes do not exhibit the preferred capacitance/voltage characteristics. For example, MA46400 and MA46600 gallium arsenide, hyperabrupt varactors from M/A-COM Semiconductor Products of Burlington, Mass. have a large tuning ratio but low breakdown voltages, e.g., $V_{BR}<50$ volts and MA45200 silicon abrupt varactors from M/A-COM Semiconductor Products have high breakdown voltages, e.g.,~90 volts, but low tuning ratios in the required transition region.

SUMMARY OF THE INVENTION

The present invention is directed to a varactor diode that exhibits a high breakdown voltage $V_{BR}$, a bi-level capacitance of $C_{max}$ and $C_{min}$, a large tuning ratio of $C_{max}/C_{min}$ and a tolerance to process variations, e.g., in doping concentrations.

These goals are realized with a doping profile that includes first, second and third regions. The first region adjoins a varactor junction, the second region adjoins the first region and the third region adjoins the second region. The first and third regions are lightly doped and the doping concentration of the second region exceeds that of the first and third regions.

To realize the high breakdown, the widths and doping concentrations of all regions are selected to limit the electric field at the junction under reverse-bias conditions. In particular, the doping concentrations are limited to increase the breakdown rating. The tuning ratio is substantially set by selection of the widths of the first and third regions. The transition voltage $V_{BR}$ between the bi-level capacitances $C_{max}$ and $C_{min}$ is substantially set by selection of the width and doping concentration of the second region.

In one embodiment, the regions are positioned in a cathode of the varactor to take advantage of the generally higher mobility of semiconductor electrons (relative to hole mobility). In another embodiment, the breakdown and thermal conductivity are enhanced by selecting InP as the semiconductor material.

The novel features of the invention are set forth with particularity in the appended claims. The invention will be best understood from the following description when read in conjunction with the accompanying drawings.

DESCRIPTION OF THE PREFERRED EMBODIMENTS

Figure 1:
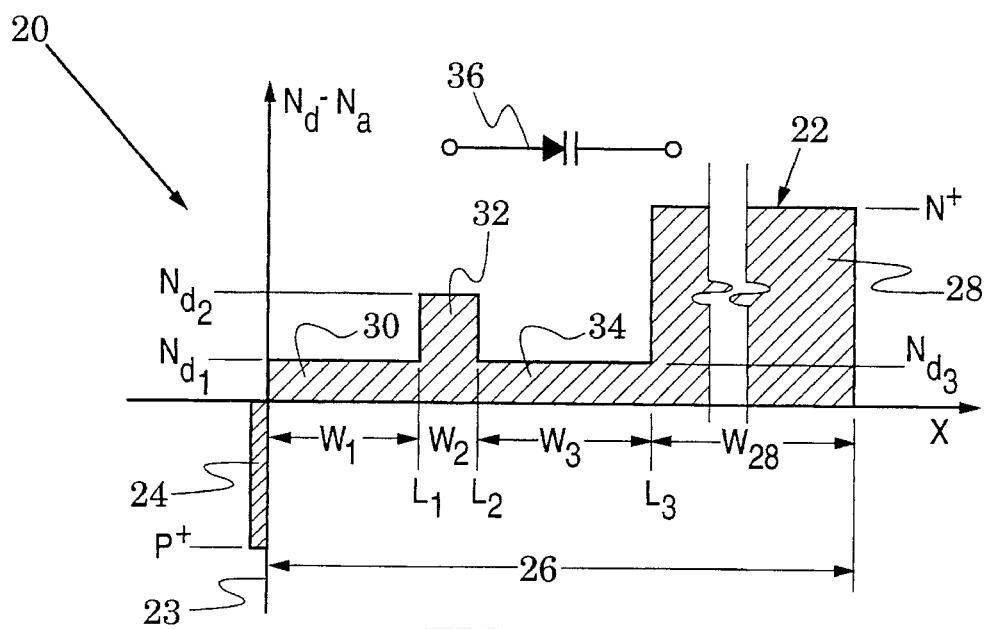
FIG. 1 is a diagram of a varactor diodesdoping profile in accordance with the present invention.

In accordance with the present invention, FIG. I illustrates a graph 20 of a varactor diode doping profile 22 which achieves the preferred varactor diode characteristics that were enumerated in the related art section. In the profile graph, the horizontal axis represents the distance x from the varactor diode junction 23 and the vertical axis represents (not to scale) the impurity doping concentration $N_d - N_a$ (number of donor atoms per cubic centimeter—number of acceptor atoms per cubic centimeter). The profile 22 includes an anode region 24 to the left of the junction 23. The anode region 24 is shallow and heavily doped p+. In the cathode region 26 to the right of the junction 23, a substrate region 28 is heavily doped n+. The substrate region 28 is typically quite thick in relation to the other regions. Accordingly, the region 28 is indicated to have a width $W_{28}$ and is broken vertically for clarity of illustration.

Between the junction 23 and the substrate 28, three n-doped regions are arranged in successive order. The first region 30 is lightly doped, the second region 32 is doped heavier than the first region 30 and the third region 34 is also lightly doped. The respective distances from the junction 23 to the right-hand edges of the regions 30, 32 and 34 are shown as $L_1$, $L_2$, and $L_3$. Thus, the first region 30 has a width $W_1$ defined by $L_1$, the second region 32 has a width $W_2$ defined by $L_2-L_1$ and the third region 34 has a width $W_3$ defined by $L_3-L_2$, In the doping profile 20, the regions 30 and 34 are lightly doped to have respective impurity concentrations $N_{d1}$ and $N_{d3}$. The region 32 is doped to have an impurity concentration of $N_{d2}$ which is greater than the concentrations $N_{d1}$ and $N_{d3}$. Thus, the regions 30, 32 and 34 can be said to have a "lo-hi-lo" doping profile. Although it is not required for the teachings of the invention, $N_{d1}$ and $N_{d3}$ are substantially equal in the doping profile 22. A symbol 36 for a varactor diode is included in the graph 20 for clarity of illustration. The symbol 36 has the same orientation as the x axis of the graph.

To develop a depletion region of length L in a semiconductor region with a doping concentration $N_d$, a reverse-bias voltage $V_r$ is required that varies directly with the doping concentration and directly with the square of the depletion length L. For example, the reverse bias required to widen the depletion region to $L_1$ is approximately $$V_1 = \frac{qN_{d1}L_1^2}{2\epsilon} - V_{bi},$$

in which q is the electron charge, $V_{bi}$ is the built-in junction potential, and $\epsilon$ is the dielectric constant of the semiconductor material. Because the doping concentration of the anode region 24 far exceeds that of the cathode regions 30, 32 and 34, the movement of the depletion region into the anode may be ignored in this conceptual discussion and the left side of the depletion region assumed to be at the junction 23. With the depletion region extended to $L_1$, the diode capacitance $C_1$ is given by $$C_1 = \frac{A\epsilon}{L_1}.$$

Equations (1) and (2) may be combined to express capacitance in terms of doping concentration and reverse bias. The resulting equation is $$C_1 = A\epsilon \left[ \frac{qN_{d1}}{2\epsilon(V_1 + V_{bi})} \right]^{1/2}.$$

This latter expression was adapted to include the contributions of each region's doping concentration and a corresponding computer simulation was developed of the capacitance of the doping profile 22. The simulation is shown as the capacitance/voltage curve 42 in the graph 40 of FIG. 2. In this simulation, the following widths and doping concentrations were assumed: $W_1$=2.0 microns, $W_2$=1200 angstroms (0.12 microns), $W_3$=3.88 microns, $N_{d1}$=$N_{d3}$=1.0× $10^{15}$ cm$^{-3}$ and $N_{d2}$=1.1×$10^{17}$ cm$^{-3}$. The vertical capacitance axis of the graph 40 is normalized to femtofarads/micron$^2$. For a varactor diode having a specific junction area $A_{sp}$, the actual capacitance would be obtained by multiplying the capacitance of the curve 42 by the diode area $A_{sp}$.

The curve 42 exhibits the bi-level capacitance of the preferred varactor. The curve 42 includes segments 43 and 44 in which the capacitance varies rapidly with bias voltage. These segments 43 and 44 substantially correspond to movement of the depletion region edge through the lightly-doped regions 30 and 34 of the doping profile 22 in FIG. 1. The curve 42 also has segments 45 and 46 in which the capacitance varies slowly with bias voltage. These segments substantially correspond to movement of the depletion region edge through the heavier-doped regions 32 and 28 of the doping profile 22.

In addition to capacitance, the varactor diode breakdown is also a function of the doping profile 22 of FIG. 1. The charge density within the depletion region is proportional to the doping concentration, i.e., proportional to the density of donor atoms. The electric field is found by integrating the electronic charges over the depletion region. If this electric field exceeds the dielectric strength of the semiconductor material, avalanche breakdown will occur.

Figure 3:
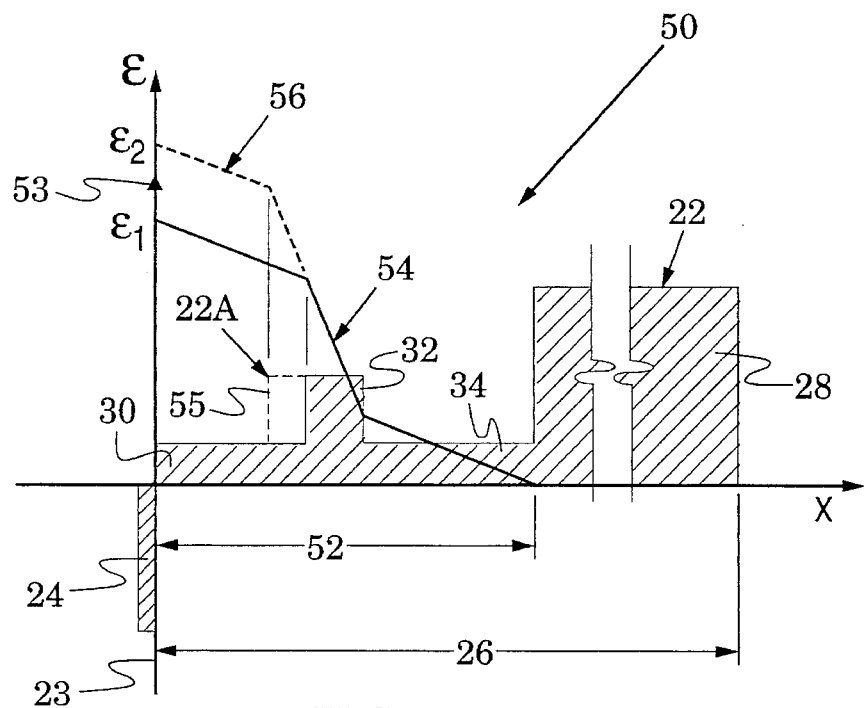
FIG. 3 is a diagram of the electric field that is developed by the doping profile of FIG. 1.

The graph 50 of FIG. 3 illustrates the integration of electronic charges across the doping profile 22 of FIG. 1. FIG. 3 is similar to FIG. 1 with like elements indicated by like reference numbers. However, the vertical axis of the graph 50 indicates the electric field $\epsilon$ (typically expressed in volts/cm). For illustrative purposes, it is assumed in FIG. 3 that the depletion width 52 is equal to $L_3$, i.e., the depletion region 52 extends between the junction 23 and the substrate 28. An exemplary semiconductor dielectric strength is indicated on the vertical axis of the graph 50 by the triangle 53.

The integration of electronic charge is shown by the integration curve 54. The integration across the region 32 has a much steeper slope than the slope across the regions 30 and 34 because of its higher charge density (due to its higher doping concentration). The integration of electronic charge across the depletion region 52 yields a peak electric field of $\epsilon_1$ at the junction 23. Integrating the area beneath the curve 54 (a second integration of electric charges) yields the bias voltage $V_r$ across the varactor diode corresponding to the depletion width 52 (for clarity of illustration, this second integration is not illustrated). If the depletion region 52 is extended sufficiently into the substrate 28, the peak electric field can be made equal to the dielectric strength 53. The integrated area under the curve 54 in this condition is the breakdown voltage $V_{BR}$ for the particular doping profile 22. This breakdown voltage is shown as the triangle 59 in FIG. 2.

A further understanding of the relationship between the profile 22 and its breakdown voltage $V_{BR}$ is facilitated by assuming a new profile in which the width $W_2$ of the region 32 is increased. In particular, the region 32 is extended towards the junction 23 as indicated by the broken lines 55 in FIG. 3 to create a new doping profile 22A. As shown by the broken line integration curve 56, an integration of the electric charges across the depletion region 52 now yields a peak electric field $\epsilon_2$ which exceeds the dielectric strength 53. For a semiconductor material having the dielectric strength 53, the depletion width 52 could be realized in the doping profile 22 without causing semiconductor breakdown. In contrast, the doping profile 22A would result in breakdown before the depletion width 52 is obtained.

Figure 2:
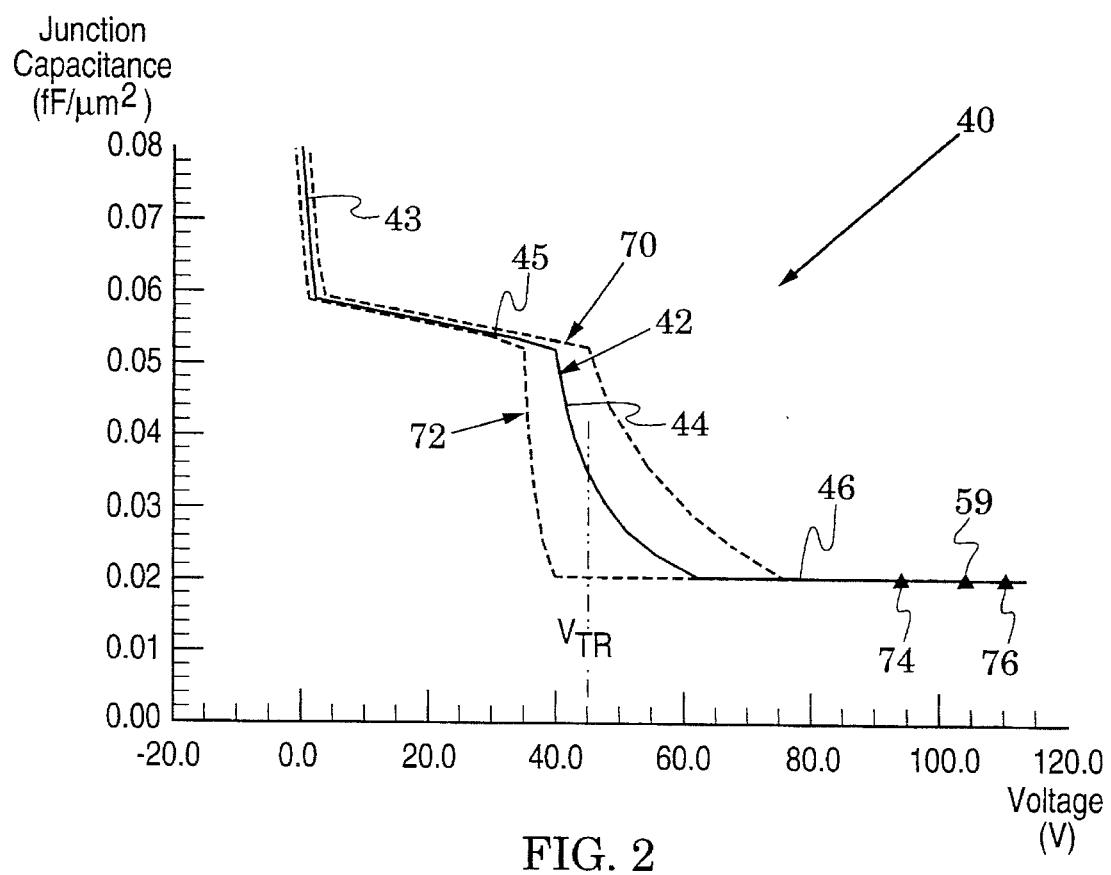
FIG. 2 is a computer-simulation diagram of the capacitance/bias voltage characteristics of a varactor diode with the doping profile of FIG. 1.

The computer simulation of FIG. 2 and the charge integration of FIG. 3 facilitate an intuitive understanding of how the doping profile 22 of FIG. 1 can be used to realize the preferred varactor characteristics. It can be observed in FIG. 2 that the widths of the lightly-doped regions 30 and 34 substantially control vertical movement of the curve 42 along the segments 43 and 44. If the doping concentration is very light in the regions 30 and 34, the segments 43 and 44 will be nearly vertical.

In contrast, the width of the heavier-doped region 32 substantially controls horizontal movement of the curve 42 along the segment 45 to the transition voltage $V_{TR}$, which is indicated approximately at the middle of the segment 44. If the doping concentration is sufficiently high in the region 32, the segment 45 will be nearly horizontal.

The curve segments 45 and 46 form the bi-level maximum capacitance $C_{max}$ and minimum capacitance $C_{min}$ regions of the preferred varactor. The width $W_3$ can be selected to be greater than the width $W_1$ to obtain a high tuning ratio of $C_{max}/C_{min}$. To increase this parameter, the ratio $W_3/W_1$ is preferably greater than 1.5 and, more preferably, greater than 2.

The heavier-doped region 32 substantially dictates the location of the transition voltage $V_{TR}$. The width $W_2$ and/or the concentration $N_{d2}$ can be adjusted to obtain a predetermined transition voltage $V_{TR}$. The concentration $N_{d2}$ is preferably high enough to produce a nearly horizontal curve segment 45.

On the other hand, FIG. 3 illustrates that the widths $W_1$ and $W_2$ and the concentration $N_{d2}$ must also be selected so that a predetermined breakdown $V_{BR}$ can be realized. Breakdown is increased by limiting the width $W_2$ and by lowering the concentration $N_{d2}$. In general, $V_{BR}$ varies directly with $N_{d2}$, directly with $W_1$, and quadratically with $W_2$. For typically anticipated transition voltages $V_{TR}$, e.g., <90 volts, the width $W_2$ can be limited to <2000 angstroms.

The doping profile 22 is preferably achieved by epitaxial growth, e.g., molecular beam epitaxy (MBE) or metal-organic chemical vapor deposition (MOCVD), in a selected semiconductor material. MOCVD forms epitaxial layers by chemical reactions between gaseous compounds of the layer constituents. MOCVD is especially suited for realizing the doping levels required in regions 30 and 34 of the doping profile 22 (of FIG. 1) because of its inherently low background carrier concentration (referred to as the "unintentional" doping level). An additional benefit of the MOCVD growth process is its low wafer defect density which results in higher product yield.

In the doping profile 22 of FIG. 1, the concentrations $N_{d1}$ and $N_{d3}$ should be as low as possible to enhance the flatness of the segments 45 and 46 ($C_{max}$ and $C_{min}$) of FIG. 2 and to increase the breakdown voltage $V_{BR}$. However, most epitaxial processes have a minimum (unintentional) doping level. For the MOCVD process, the unintentional level is generally in the the range of $3\times10^{14}$ cm$^{-3}$ to $5\times10^{14}$ cm$^{-3}$.

Although breakdown voltages on the order of 50 volts can be achieved with $N_{d1}$ and $N_{d3}$ set at less than $1\times10^{16}$ cm$^{-3}$ and with $N_{d2}$ less than $5\times10^{17}$ cm$^{-3}$, these respective concentrations are preferably less than $5\times10^{15}$ cm$^{-3}$ and $3\times10^{17}$ cm$^{-3}$ to obtain breakdown voltages on the order of 70 volts and, more preferably, less than $1\times10^{15}$ cm$^{-3}$ and $1\times10^{17}$ cm$^{-3}$ to obtain breakdown voltages on the order of 100 volts. Thus, the teachings of the invention include a careful selection of doping concentrations and widths of the regions 30, 32 and 34 to avoid breakdown under typical varactor diode operating conditions.

The doping profile 22 of FIG. 1 can be realized in any semiconductor material. The material is preferably selected for those properties, e.g., carrier saturated velocity, thermal conductivity, dielectric strength and mobility, that will meet the needs of each varactor diode application. For example, in a resonant converter of a power electronics system, large bias voltages and high power dissipation are generally expected. In this application, a semiconductor would preferably be selected that has a high dielectric strength and good thermal conductivity, e.g., indium phosphide (InP). In contrast, if high switching speed were the dominant consideration, GaAs might be selected because of its high mobility which reduces series resistance with a consequent lowering of the RC charging time.

Once the semiconductor material has been selected, the anode and cathode impurity dopants can be chosen from materials well known in the semiconductor art, e.g., n-type and p-type silicon are generally realized respectively with arsenic or phosphorous donor atoms and boron acceptor atoms.

Figure 4:
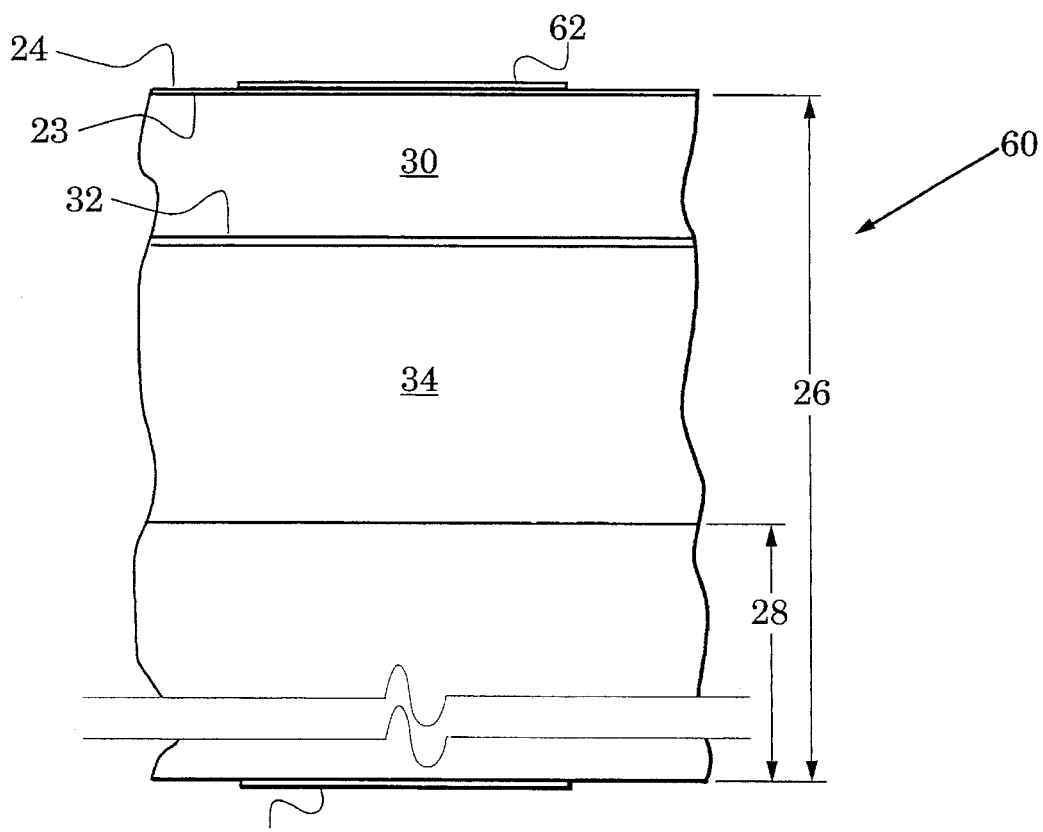
FIG. 4 is an enlarged sectional view of a varactor diode which is fabricated in accordance with the doping profile of FIG. 1.

FIG. 4 illustrates a greatly enlarged sectional view of a varactor diode 60 which has the doping profile 22 of FIG. 1 and, in particular, the region widths that were assumed in the computer simulation of FIG. 2, i.e., $W_1=2.0$ microns, $W_2=1200$ angstroms (0.12 microns) and $W_3=3.88$ microns. The width of the substrate 28 would typically be on the order of 500 microns and is, therefore, shown with its midsection broken away. The elements of FIG. 4 are indicated with the same reference numbers that they have in FIG. 1. In addition, an ohmic contact 62 is deposited on the anode 24 and an ohmic contact 64 is deposited on the substrate 28. The ohmic contact metals are chosen to enhance contact with the selected semiconductor material of the varactor diode. For example, if InP is the material of the varactor diode 60, the ohmic contacts 62 and 64 are preferably gold/platinum/titanium (Au/Pt/Ti) layers. The anode 24 and substrate 28 are preferably heavily doped, e.g.,~$1\times10^{19}$ cm$^{-3}$, to enhance the low resistance of the ohmic contacts. The cross-sectional area of the anode 24 and cathode 26 would conventionally be defined by mesa-etching and the chip sliced away from the fabricated wafer. The exposed periphery of the junction 23 would preferably be protected from the environment by a coating, e.g., polyimide.

In the computer simulation of FIG. 2, the sensitivity of capacitance and breakdown voltage to changes in doping concentration is also illustrated. In the simulation, a first variation of doping concentrations in the profile 22 of FIG. I is investigated in which there is a 10% increase in $N_{d2}$ and a 50% increase in $N_{d1}$ and $N_{d3}$. The capacitance for this variation is shown as the broken-line curve 70. A second variation is investigated in which there is a 10% decrease in $N_{d2}$ and a 50% decrease in $N_{d1}$ and $N_{d3}$. The capacitance for this second variation is shown as the broken-line curve 72. These variations were selected because, in practice, the percentage variation in doping concentration increases as the nominal concentration is less, i.e., it is difficult to closely control low doping concentrations.

The change of $C_{max}$ and $C_{min}$ from their nominal values is minimal for both concentration variations. With the nominal doping concentrations illustrated by the curve 42, the transition from $C_{max}$ to $C_{min}$ was completed between 40 and 60 volts. In the first concentration variation illustrated by the curve 70, the transition from $C_{max\ 1\ to\ Cmin}$ occurred between 45 and 75 volts. In the second concentration variation illustrated by the curve 72, the transition from $C_{max}$ to $C_{min}$ occurred between 35 and 45 volts. The calculated breakdown voltage $V_{BR}$ for the first and second variations are shown respectively as the triangles 74 and 76. For many resonant converter applications, the change in the transition voltage is acceptable.

As shown in FIG. 2, the transition voltage is sharpest when the doping concentrations of $N_{d1}$ and $N_{d3}$ are lower. It is also evident from the graph 50 of FIG. 3 that lowering the doping concentrations $N_{d1}$ and $N_{d3}$ will lower the peak electric field at the junction and, therefore, increase the diode's breakdown voltage $V_{BR}$. In general, the lowest achievable doping level is preferably used for the regions 30 and 34 to increase the breakdown rating and sharpen the transition at $V_{TR}$.

FIG. 2 shows that the capacitance characteristics which are realized with the doping profile 22 are reasonably tolerant to doping concentration variations as long as the nominal value of $N_{d2}$ is held to approximately $\pm10\%$. A 10% accuracy for a nominal doping concentration of $1\times10^{17}$ cm$^{-3}$ is well within the capability of epitaxial processes such as MBE and MOCVD. The capacitance characteristics do require careful control of the epitaxial layer widths, i.e., $W_1$, $W_2$ and $W_3$, but epitaxial thickness control is a feature of MBE and MOCVD. Therefore, because of their inherent tolerance to doping variations in the epitaxial growth process, varactor structures in accordance with the teachings of the invention are well suited for high-volume manufacturing environments.

Figure 5:
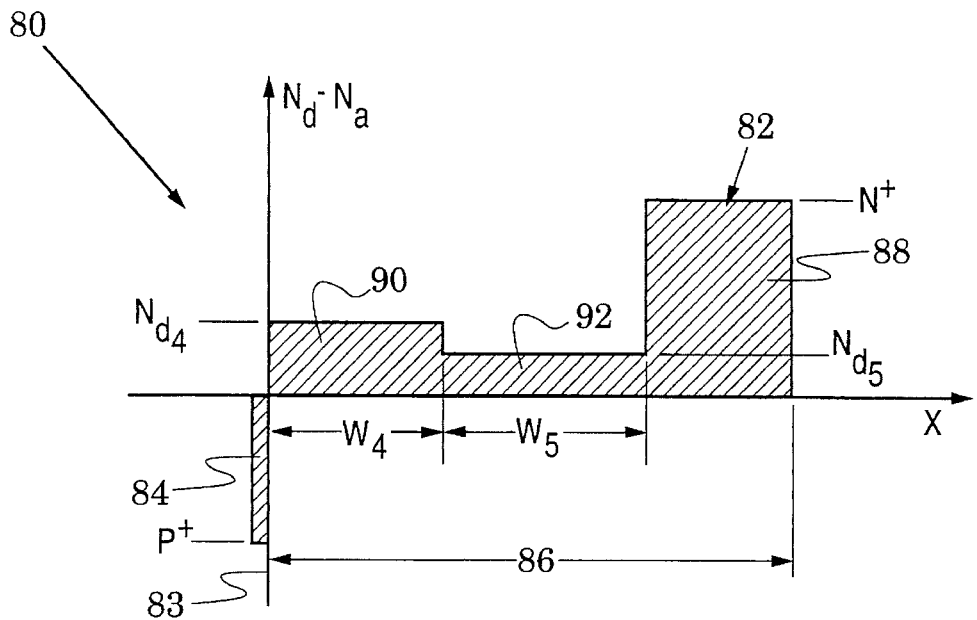
FIG. 5 is a diagram of a conventional varactor diode doping profile.
Figure 6:
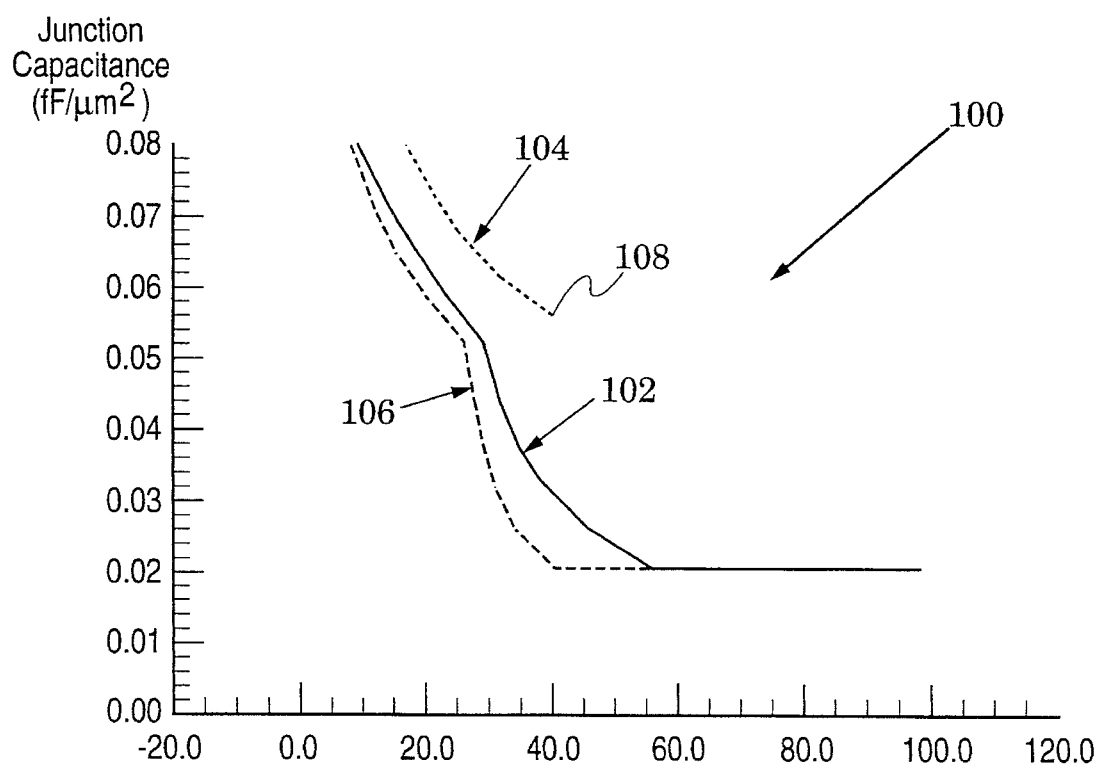
FIG. 6 is a computer-simulation diagram of the capacitance/bias voltage characteristics of a varactor diode with the conventional doping profile of FIG. 5.
Figure 7:
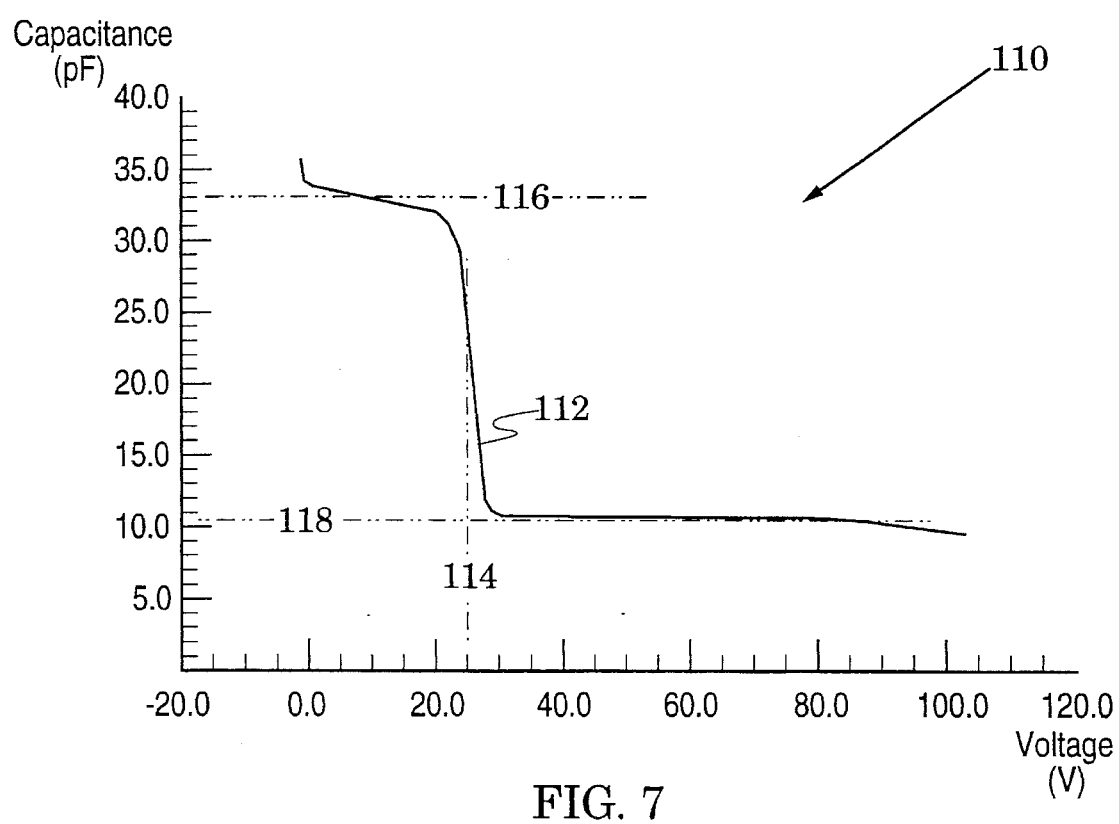
FIG. 7 is a graph of the measured capacitance/bias voltage characteristics of an exemplary varactor diode that was fabricated in accordance with the doping profile of FIG. 1.

In contrast with the doping variation tolerance illustrated in FIG. 2 for the doping profile of FIG. 1, FIG. 6 shows the sensitivity of a conventional "hi-lo" varactor diode doping profile to changes in doping concentration. In the graph 80 of FIG. 5, this conventional doping profile 82 has a heavily doped anode region 84 and a cathode region 86 on both sides of a junction 83. The cathode region 86 includes a heavily doped substrate region 88. Between the junction 83 and the substrate 88, a first cathode region 90 has a doping concentration $N_{d4}$ of $9.5\times10^{15}$ cm$^{-3}$ and an adjoining second cathode region 92 has a doping concentration $N_{d5}$ of $1.5\times10^{15}$ cm$^{-3}$. The first region 90 has a width $W_4$ of 2.2 microns and the second region 92 has a width $W_5$ of 3.2 microns.

A computer simulation of the capacitance characteristics of the doping profile 82 is shown as the curve 102 in the graph 100 of FIG. 6. In this simulation, a first variation of doping concentrations is investigated in which there is a 10% increase in $N_{d4}$ and a 50% increase in $N_{d5}$. The capacitance for this variation is shown as the broken-line curve 104. A second variation is investigated in which there is a 10% decrease in $N_{d4}$ and a 50% decrease in $N_{d5}$. The capacitance for this second variation is shown as the broken-line curve 106.

It can be seen that the conventional doping profile 82 of FIG. 5 generates a poorly defined bi-level capacitance characteristic. In addition, the curve 104 has a premature termination 108 because of diode breakdown before even reaching the desired $C_{max}/C_{min}$ transistion voltage. Thus, the conventional doping profile does not exhibit the process tolerance of the doping profile of the present invention.

An exemplary varactor diode was fabricated in accordance with the doping profile 22 of FIG. 1. In this diode, a design goal of 25 volts was selected for the transition voltage $V_{TR}$. The epitaxial layers were grown in InP with the MOCVD process. With reference to FIG. 1, the exemplary varactor diode was fabricated with unintentional doping concentrations for $N_{d1}$ and $N_{d3}$ in the range of $3\times10^{14}$ cm$^{-3}$ to $5\times10^{14}$ cm$^{-3}$ and a concentration for $N_{d2}$ of approximately $8\times10^{16}$ cm$^{-3}$. The concentration for $N_{d1}$ and $N_{d3}$ was set by the unintentional concentration level of the MOCVD equipment. The concentration of $N_{d2}$ was selected to obtain the predetermined $V_{TR}$ design goal. The junction was mesa-etched to a diameter of 800 microns and ohmic contacts were deposited to provide low resistance contacts to the anode and cathode regions.

The measured results are shown in the graph 110 of FIG. 5. The capacitance/reverse-bias curve 112 has a transition voltage 114 of approximately 25 volts. The capacitance has a $C_{max}$ 116 of substantially 33 picofarads for 0 $V_r$ 20 volts with a variation of about $\pm3\%$, and a $C_{min}$ 118 of substantially 10.5 picofarads for 30 $V_r$ 90 volts with a variation of about $\pm5\%$. The tuning ratio ($C_{max}/C_{min}$) was 33/10.5~3.

A varactor diode of greater or lesser capacitance can be fabricated with an appropriate scaling of the junction cross-sectional area. Alternatively, greater capacitance can be obtained by connecting multiple varactor diodes in parallel.

In semiconductor materials, electron mobility generally exceeds hole mobility. The doping profile 22 of FIG. I exploits this mobility difference by positioning the regions 30, 32 and 34 in the cathode 26. However, the teachings of the invention can be extended to other varactor embodiments in which the regions 30, 32 and 34 are positioned in the anode 24. In FIG. 1, this embodiment of the invention would be illustrated by interchanging the reference numbers 24 and 26 and the symbols $N^+$ and $P^+$.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

I claim:

1. A high breakdown voltage, bi-level capacitance varactor diode, comprising:

an anode formed of p-type indium phosphide; and a cathode formed of n-type indium phosphide and joined to said anode at a junction between them;

wherein one of said cathode and said anode has first, second and third regions in which;

a) said first region adjoins said junction, has an impurity doping concentration $N_{d1}$ and a width $W_1$;

b) said second region adjoins said first region, has an impurity doping concentration $N_{d2}$ and a width $W_2$ which is less than 0.2 micron;

c) said third region adjoins said second region, has an impurity doping concentration $N_{d3}$ and a width $W_3$ which is greater than $1.5W_1$;

d) $N_{d2}$ is less than $3 \times 10^{17}$ cm$^{-3}$ and greater than $N_{d1}$ and $N_{d3}$; and e) $N_{d1}$ and $N_{d3}$ are each less than $1 \times 10^{15}$ cm$^{-3}$.

2. The varactor diode of claim 1, wherein $N_{d2}$ is less than $1 \times 10^{17}$ cm$^{-3}$.

3. The varactor diode of claim 1, wherein $N_{d1}$ substantially equals $N_{d3}$.

4. The varactor diode of claim 1, wherein $W_3$ is greater than $2W_1$.

5. The varactor diode of claim 1, wherein said cathode includes said first, second and third regions.

6. The varactor diode of claim 1, further including an indium phosphide substrate adjoining said third region.

* * * * *